United States Patent [19]

Rudnick

[11] Patent Number: 4,777,140

[45] Date of Patent: Oct. 11, 1988

[54] MEASUREMENT OF VANADIUM CONTENT IN A REFINERY STREAM BY ELECTRON SPIN RESONANCE SPECTROSCOPY

[75] Inventor: Leslie R. Rudnick, Lawrenceville, N.J.

[73] Assignee: Mobil Oil Corporation, New York, N.Y.

[21] Appl. No.: 54,048

[22] Filed: May 26, 1987

[51] Int. Cl.$^4$ ............................................. G01N 24/10
[52] U.S. Cl. ......................................... 436/55; 436/60; 436/83; 436/173; 422/62; 208/50; 324/316
[58] Field of Search ..................... 436/55, 60, 83, 173; 422/62; 208/50; 324/316

[56] References Cited

U.S. PATENT DOCUMENTS

| | | | |
|---|---|---|---|
| 2,909,482 | 10/1959 | Williams et al. | 324/316 X |
| 3,719,453 | 3/1973 | Erdman | 436/173 X |
| 3,740,641 | 6/1973 | Hwang et al. | 436/173 X |
| 4,415,671 | 11/1983 | Nicksic | 436/173 X |

OTHER PUBLICATIONS

Asaoka et al., Ind. Eng. Chem. Process Des. Dev., 1983, 242-248.
Tynan et al., Fuel, 1969, 48(2), 191-208.
Yen et al., Amer. Che. Soc., Div. Fuel Chem. Preprints, 1967, 11(4), 264-76.
Petrakis et al, Analytical Chemistry, vol. 50, No. 2, Feb. 1978, pp. 303-308.
Yen et al., Analytical Chemistry, vol. 34, No. 6, May 1962, pp. 694-700.
Saraceno et al., Analytical Chemistry, vol. 33, No. 4, Apr. 1961, pp. 500-505.

Primary Examiner—Michael S. Marcus
Attorney, Agent, or Firm—Alexander J. McKillop; Michael G. Gilman; Charles J. Speciale

[57] ABSTRACT

In the control of a refinery process, vanadium content of the hydrocarbon streams is determined by measuring the intensity of the 5 isotropic and 6 anisotropic ESR spectral peaks. The ln of the sum of the intensities of these two peaks has a linear relationship to vanadium content.

7 Claims, 4 Drawing Sheets

MEASUREMENT OF VANADIUM CONTENT IN A REFINERY STREAM BY ELECTRON SPIN RESONANCE SPECTROSCOPY

This is a continuation of copending application Ser. No. 646,287, filed on Aug. 31, 1984 abandoned.

BACKGROUND OF THE INVENTION

This invention relates to monitoring the vanadium content of the streams in a refinery process and more particularly, to the measurement of vanadium content by measuring the intensity of selected peaks of the ESR spectra.

The vanadium content of a refinery feedstock is one of the principal variables which must be monitored in a refinery process. The type of catalyst used and the severity of cracking are determined in large part by vanadium content of the feedstream. The analysis of vanadium content in refinery feedstocks has typically been done by wet chemical analysis. This is a time consuming procedure and the resultant vanadium content is not typically available in a form which can be used for on-line control of the refinery process.

Electron spin resonance spectroscopy (ESR) has become an important analysis tool. Typical laboratory spectrometers using this technique are described in Assenheium, "Introduction to Electron Spin Resonance," Plenum Press, 1967, pp. 52–56. ESR has been used for the analysis of feedstocks in refinery processes. It is known that certain peaks in the ESR spectra indicate the presence of vanadium in the asphaltenes in refinery processes. See Asaoka, et al, "Asphaltene Cracking in Catalytic Hydrotreating of Heavy Oils," Ind. Eng. Chem. Process Des. Dev. 1983, 242–248 and particularly FIGS. 7 and 8 of that article. However, to my knowledge no one has successfully made quantitative measurements of the amount of vanadium present in unseparated refinery feedstocks from ESR measurements.

RELATED APPLICATIONS

"Electron Spin Resonance Spectroscopy For Measuring Coking Tendency In A Refinery Process", Ser. No. 382,512, filed May 27, 1982, Rudnick now abandoned; and "Electron Spin Resonance Spectroscopy For Measuring Bitumen Content Of Tar Sands", Ser. No. 382,513, filed May 27, 1982, Rudnick.

SUMMARY OF THE INVENTION

In accordance with the present invention, the vanadium content of the streams of a refinery process are measured by electron spin resonance spectroscopy and measurements are used for process control. The invention has the advantage that the vanadium level can be determined at any location where samples can be routinely taken, provided that a prior calibration of signal levels and vanadium content is made. The invention provides a rapid technique for measuring the vanadium content of a feed or product refinery stream. The vanadium content of high metal resids and feeds to the coker, for example, allow the prediction of the quality of coke produced by monitoring the vanadium content of the coker feed.

In accordance with the invention, the sum of the intensities of the 5 isotropic and 6 anisotropic peaks of the ESR spectra are indicative of the vanadium content. The intensities of these peaks are measured for particular hydrocarbons having known vanadium content. The measured intensity of these selected peaks are used to calibrate vanadium content as a function of the intensity of the 5 isotropic and 6 anisotropic spectral peaks in unknown samples. During the operation of the refinery process, the intensity of these peaks in the ESR spectra is measured for refinery streams having unknown vanadium content. From these measurements, and from the calibration of intensity, the vanadium content of the refinery streams is measured.

The foregoing and other objects, features and advantages of the invention will be better understood from the following more detailed description and appended claims.

SHORT DESCRIPTION OF THE DRAWINGS

FIGS. 1A and 1B together show a refinery with ESR measurement of vanadium content of hydrocarbon streams in accordance with the invention;

DESCRIPTION OF THE PREFERRED EMBODIMENT

Figure 1A:
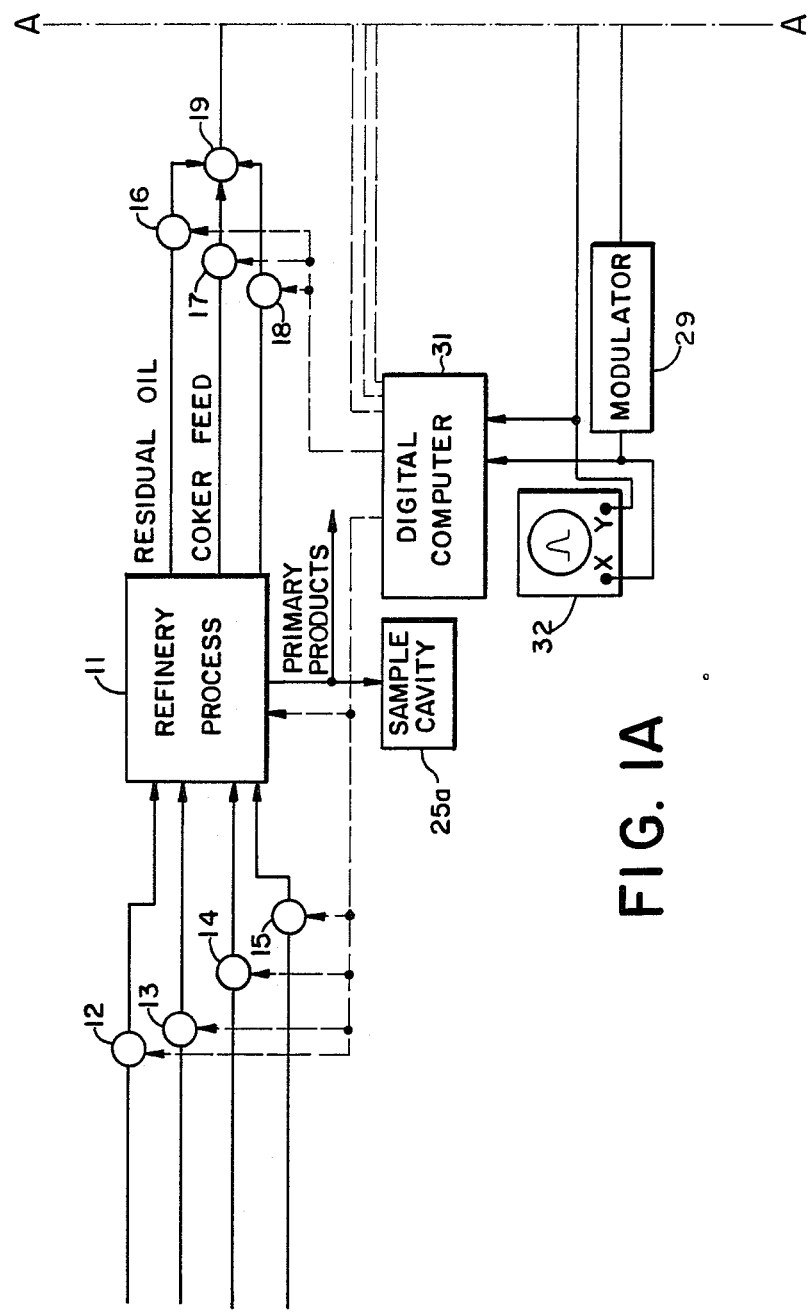
Figure 1B:
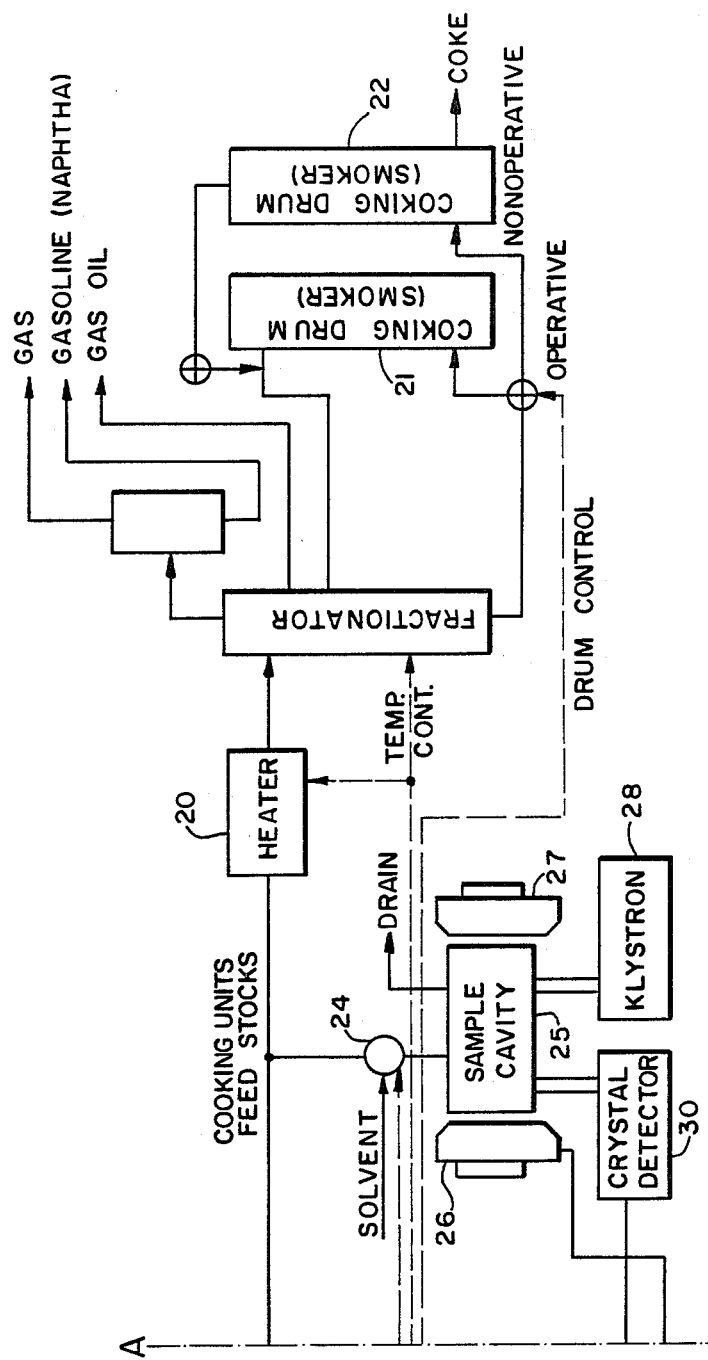

Referring to FIGS. 1A and 1B, the refinery process 11 is supplied with hydrocarbon feedstocks which may be from a variety of fossil fuel sources such as different grades of petroleum crude. The various hydrocarbon feedstocks are selected by control of the valves 12–15. The refinery process 11 produces primary products such as gasoline, naphtha and heating oil. The by-products of the refinery process include, for example, residual oil, coker feed oil and reduced crude. These are directed through valves 16–19 to the coking unit. The coking unit may include a preheater 20. The particular coking unit shown by way of example is a delayed coking process in which the heated charge is transferred to large coking drums 21 and 22 which provide the long residence time needed to allow the cracking reactions to proceed to completion.

The feedstocks are introduced into the fractionator where they are heated and lighter fractions are removed as side streams. The heated fractionator bottoms enter one of the two coking drums 21 and 22 where the cracking reactions continue. The cracked products leave as overheads and coke deposits form on the inner surface of the drum. Overhead products from the coking drums are returned to the fractionator.

In accordance with the present invention, a small sample of each stream to be analyzed is supplied through valve 24, for example, to a quartz sample tube which is positioned in the sample cavity of the ESR spectroscopy unit. Sample cavities 25 and 25a have been shown, but others can be provided at locations where vanadium content is to be monitored. Because some feedstocks are quite viscous, continuous flow of even a small stream of sample will result in a buildup of feedstock on the quartz tube which will ultimately result in faulty measurements. In order to prevent this, valve 24 is operated intermittently to provide sample feedstock and solvent to the sample tube. These samples and the solvent are alternately flushed to drain.

A magnet, indicated at 26 and 27, applies a magnetic field to the sample in the cavity 25. A klystron 28 provides a source of microwave power to the cavity. The magnetic field, or the frequency of the microwave energy, is varied to pass through the resonant condition of the sample. Typically the magnetic field is varied as by the modulator 29. The spin resonance of the sample is detected by crystal detector 30, the output of which is supplied to the digital computer 31. Many commercial ESR measuring apparatus already include small digital computers to provide outputs in the desired form. The more conventional video output of the ESR measuring equipment is produced by the CRT 32 which produces an output representing the peaks in the resonant spectra.

Figure 2A:
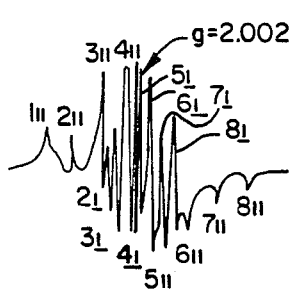
FIGS. 2A and 2B depict anisotropic and isotropic ESR spectral peaks.
Figure 2B:
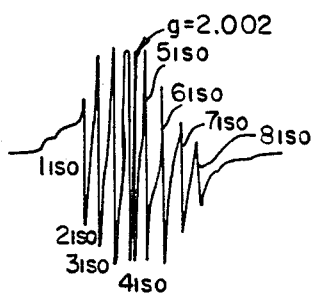

FIG. 2A shows the anisotropic ESR spectra indicating the presence of vanadium in the sample, and FIG. 2B shows the isotropic spectra. FIGS. 2A and 2B are typical of the sixteen line anisotropic and eight line isotropic vanadyl resonance produced by petroleum asphaltene samples. I have found an unexpected relationship between the intensity of the 5 isotropic peak and the 6 anisotropic peak. Specifically, I have found a linear relationship between the natural log of the sum of the amplitudes of these two peaks, and vanadium content as measured by other techniques. As an example of this relationship, eight refinery products consisting of resids and coker feeds were examined by ESR. The sum of the intensities of the 5 isotropic and 6 anisotropic peaks were measured graphically. These were compared with vanadium content obtained by elemental analysis. A comparison of the measured intensities and the known vanadium content of the samples is given below.

|  | Sample | 5iso[1] | 6aniso[1] | Vanadium[2] |
|---|---|---|---|---|
| Arab Light (650+) | 1 | 0.20 | 2.58 | 21.0 |
| Defler Corp. Coker Feed | 2 | 1.85 | 55.20 | 545.0 |
| Joliet Coker Feed | 3. | 0.69 | 20.20 | 170.0 |
| Joliet Coker Feed | 4. | 0.84 | 23.60 | 200.0 |
| N. Slope Vac Resid (950+) | 5. | 0.39 | 8.88 | 74.0 |
| N. Slope Atm Resid | 6. | 0.35 | 8.75 | 70.0 |
| Arab Light Raw Resid | 7. | 0.35 | 7.45 | 61.0 |
| Arab Light Vac Resid | 8. | 0.36 | 7.70 | 65.0 |

[1] by ESR
[2] by elemental analysis

Figure 3:
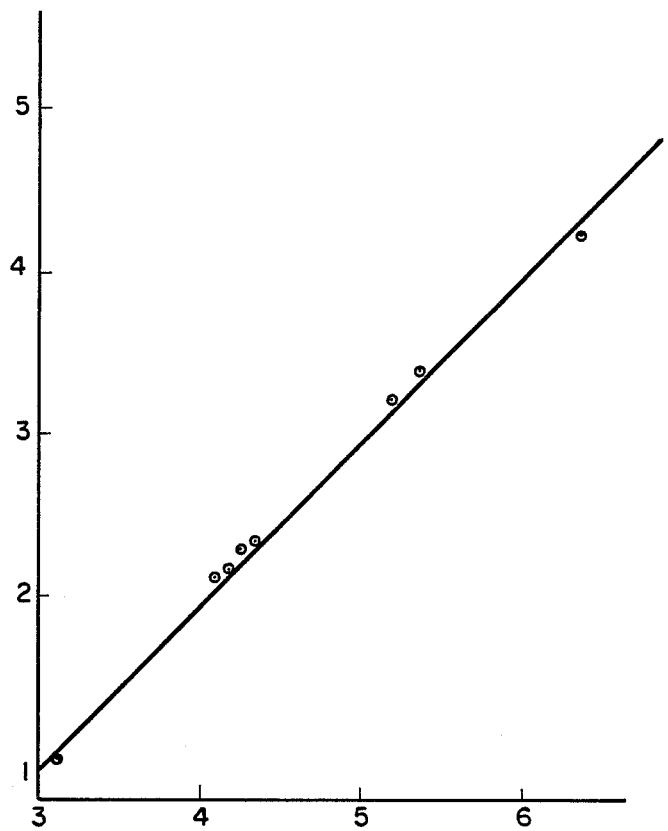
FIG. 3 is a plot showing the calibration of vanadium content with the sum of the intensity of anisotropic and isotropric spectral peaks in one example.

The ln of the sum of these two intensities is plotted as a function of known vanadium content in FIG. 3. The measured points show a linear relationship with a correlation coefficient of 0.998.

Once this relationship is established for a particular ESR measuring system, unknown samples can be measured and the unknown vanadium content of the samples can be determined from the calibration relationship and from the measured intensity of the 5 isotropic and 6 anisotropic peaks. Rapid analysis in this manner allows for improved process control and prediction of product quality. Future new processing alternatives for higher metal feedstocks benefit significantly from such rapid and accurate process control information.

Figure 4:
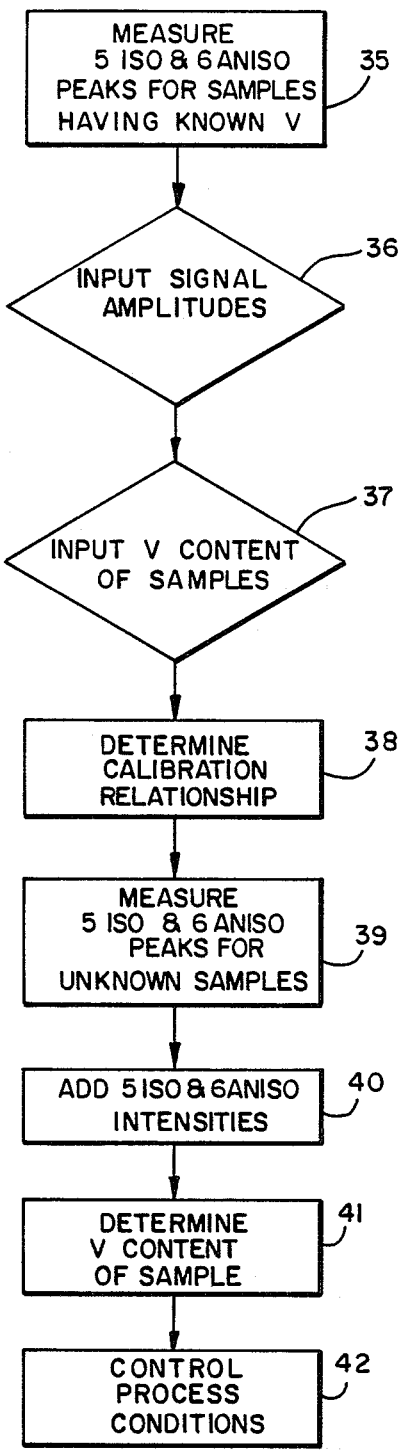
FIG. 4 is a flowchart depicting the invention.

FIG. 4 is a flowchart depicting the operation of the invention. The intensity of the 5 isotropic and 6 anisotropic peaks in hydrocarbon samples having known vanadium content are measured as indicated at 35. The signal amplitudes and known vanadium content of the samples are inputs to the digital computer 31, as indicated at 36 and 37. From these inputs, the calibration relationship, depicted graphically in FIG. 3, is determined, as indicated at 38.

During operation of the refinery process, the intensity of the 5 isotropic and 6 anisotropic peaks for hydrocarbon streams having unknown vanadium content are measured, as indicated at 39. The intensity of the 5 isotropic and 6 anisotropic peaks are added as indicated at 40. From the measured intensities and the calibration relationship, the vanadium content of the hydrocarbon streams is determined as indicated at 41. This determined vanadium content is used to control process conditions, as indicated at 42. Typically, severity of the refinery process 11 is controlled, or the mixture of the feedstocks is changed by control of valves 12–15. Alternatively, the quality of the coke may be controlled by controlling the feed to the coker unit by control of valves 16–18. Numerous other refinery process conditions may be controlled from measured vanadium content.

While a particular embodiment has been shown and described, various modifications are within the true spirit and scope of the invention. The appended claims are, therefore, intended to cover all such modifications.

What is claimed is:

1. In the method of controlling the severity of a refinery process the steps of:

measuring the intensity of the no. 5 isotropic and no. 6 anisotropic peaks of the ESR spectra of hydrocarbons having known vanadium content;

from the sum of the measured intensity of the no. 5 isotropic and no. 6 anisotropic peaks in said spectra, preparing a calibration of the vanadium content of hydrocarbon streams as a function of the intensity of the selected spectral peaks;

feeding feedstocks to said refinery process;

during the operation of said refinery process, measuring the intensity of said selected no. 5 isotropic and no. 6 anisotropic peaks in the ESR spectra of said feedstocks having unknown vanadium content and determining the sum of said intensities; and determining the vanadium content of said peaks and from the calibration of the sum of the intensities of said selected peaks with vanadium content.

2. The method recited in claim 1 wherein the step of calibrating includes determining the linear relationship between the natural logarithm of the sum of intensities of the no. 5 isotropric and no. 6 anisotropic peaks and the known vanadium content.

3. The method recited in claim 1 further comprising: controlling the mixture of said feedstocks in response to the determined vanadium content of said stream.

4. The method recited in claim 1 wherein the known vanadium content is determined by chemical means.

5. The method of controlling the quality of coke in a refinery process comprising:

measuring the intensity of the no. 5 isotropic and no. 6 anisotropic peaks of the ESR spectra of hydrocarbons having know vanadium content;

from the sum of the measure intensity of the no. 5 isotropic and no. 6 anisotropic peaks in said spectra, preparing a calibration of the vanadium content of hydrocarbon streams as a function of the intensity of the selected spectral peaks;

feeding feedstocks to a coking unit in said refinery process;

measuring the intensity of the no. 5 isotropic and no. 6 anisotropic peaks of the ESR spectra of said hydrocarbon stream and determining the sum of said intensities;

determining the vanadium content of said refinery stream from the sum of the measured intensities of said peaks and from the calibration of the sum of the intensities of said peaks with vanadium content; and controlling the flow of said feedstocks to said coking unit in response to the measured vanadium content of said feedstocks to control the quality of coke produced by said coking unit.

6. The method recited in claim 5 wherein the step of calibrating includes determining the linear relationship between the natural logorithm of the sum of the no. 5 isotropric and no. 6 anisotropic peaks and known vanadium content.

7. The method recited in claim 5 wherein the known vanadium content is determined by chemical means.

* * * * *